United States Patent
Bellotti et al.

(10) Patent No.: US 11,936,295 B2
(45) Date of Patent: Mar. 19, 2024

(54) CHARGE PUMP CIRCUIT RELATED TO OVERVOLTAGE

(71) Applicant: SK hynix Inc., Icheon-si (KR)

(72) Inventors: Giovanni Bellotti, Agrate Brianza (IT); Miriam Sangalli, Agrate Brianza (IT); Lorenzo Bonuccelli, Agrate Brianza (IT); Marco Passerini, Agrate Brianza (IT)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/097,862

(22) Filed: Jan. 17, 2023

(65) Prior Publication Data
US 2023/0402916 A1 Dec. 14, 2023

(30) Foreign Application Priority Data

Jun. 10, 2022 (IT) .......................... 102022000012356

(51) Int. Cl.
  *H02M 3/07* (2006.01)
  *G11C 5/14* (2006.01)
  *H02M 1/00* (2006.01)
  *H02M 3/155* (2006.01)

(52) U.S. Cl.
  CPC ............. *H02M 3/075* (2021.05); *G11C 5/145* (2013.01); *H02M 1/009* (2021.05); *H02M 3/155* (2013.01)

(58) Field of Classification Search
  None
  See application file for complete search history.

(56) References Cited

U.S. PATENT DOCUMENTS

| 6,486,728 | B2 * | 11/2002 | Kleveland | H02M 3/073 |
| | | | | 327/539 |
| 8,339,185 | B2 | 12/2012 | Cazzaniga et al. | |
| 8,659,860 | B2 | 2/2014 | George et al. | |

(Continued)

FOREIGN PATENT DOCUMENTS

EP 2031546 A2 3/2009

OTHER PUBLICATIONS

Roberto Pelliconi et al., "Power Efficient Charge Pump in Deep Submicron Standard CMOS Technology", IEEE Journal of Solid-State Circuits (vol. 38, Issue: 6, Jun. 2003), STMicroelectronics, Agrate Brianza, Italy.

(Continued)

*Primary Examiner* — Jeffery S Zweizig
(74) *Attorney, Agent, or Firm* — William Park & Associates Ltd.

(57) ABSTRACT

A charge pump circuit is provided, comprising: a first charge pump having an input terminal for receiving a supply voltage and configured to boost the received supply voltage to provide at an output terminal of the first charge pump a first charge pump voltage; a second charge pump having an input terminal coupled to the output terminal of the first charge pump for receiving the first charge pump voltage and configured to boost the received first charge pump voltage to provide at an output terminal of the second charge pump a second charge pump voltage, and a voltage drop sensing device configured to detect drops in the first charge pump voltage and to deactivate second transistors of bypass units associated to the disabled charge pump stages when a drop in the first charge pump voltage is detected.

12 Claims, 7 Drawing Sheets

(56) References Cited

U.S. PATENT DOCUMENTS

| | | | |
|---|---|---|---|
| 8,704,587 B2* | 4/2014 | Ramanan | G11C 5/145 |
| | | | 363/59 |
| 10,033,271 B1 | 7/2018 | Shay et al. | |
| 11,031,866 B2* | 6/2021 | Niederberger | H02M 3/07 |
| 2005/0127981 A1 | 6/2005 | Lee et al. | |
| 2012/0169405 A1 | 7/2012 | Choi | |

OTHER PUBLICATIONS

Younis Allasasmeh et al., "Fast-Startup High-Efficiency Tripler Charge Pump in Standard 0.18-μm CMOS Technology", 2018 IEEE International Symposium on Circuits and Systems (ISCAS), IEEE, Florence, Italy.

* cited by examiner

CHARGE PUMP CIRCUIT RELATED TO OVERVOLTAGE

CROSS-REFERENCE TO RELATED APPLICATION

The present application claims priority under 35 U.S.C. § 119(a) to Italian patent application number 102022000012356, filed on Jun. 10, 2022, in the Italian Intellectual Property Office, the entire disclosure of which is incorporated herein by reference.

TECHNICAL FIELD

Various embodiments generally relate to the field of electronics and, more particularly, to charge pump circuits.

RELATED ART

A charge pump is an electronic circuit configured to convert an input DC supply voltage to an output DC voltage that is (e.g., several times) higher than the input supply voltage by using capacitors as energy-storage elements to function as a DC-DC voltage boosting converter.

Usually, charge pumps are used in those circuit systems that require for their operations voltages higher (in absolute vale) than the supply voltages of the circuit systems themselves.

For example, electronic non-volatile memory devices such as EEPROM (Electrically Erasable Programmable Read Only Memory), and particularly flash memory devices, require one or more charge pumps for correct operation.

U.S. Pat. No. 8,339,185 discloses a multi-stage charge pump configured to select the number of active stages dynamically. This is done by having a multi-stage master charge pump section in which the number of active stages is settable and a slave charge pump section that is of the same design as the master section. The master section is used to drive the external load, while the slave section drives an adjustable internal load. The adjustable internal load is set by control logic by comparing the operation of the two sections. The control logic then operates the slave section with a different number of active stages than the master stage in order to determine whether the master stage is using the optimal number of active stages. The control logic can then change the number of active stages accordingly.

U.S. Pat. No. 10,033,271 discloses a multi-stage charge pump including first, second and third charge pump stages connected in series. Each of the first, second and third charge pump stages includes a charge pump circuit of a first type that increases an input signal of a respective charge pump circuit by up to a given amount. The multi-stage charge pump also includes a level shifter that swings a level clock signal between a voltage of an output signal of the third charge pump stage and one of an offset voltage and ground. The multi-stage charge pump further includes a charge pump circuit of a second type that increases the voltage of the output of the third charge pump stage by up to another amount and provides an output and the other amount is set by the level shifter. Also, the multi-stage charge pump includes a charge pump circuit of a third type.

U.S. Pat. No. 8,659,860 discloses a power converter including a transient voltage protection circuit connected between an input of the power converter and a power stage of the power converter. The transient voltage protection circuit provides a low resistance connection from the input of the power converter to the power stage of the power converter when the input voltage is less than a predetermined threshold, but blocks the input voltage from the power stage when the input voltage is equal to or greater than the predetermined threshold voltage. The power converter may be a boost power converter used in a vehicle to provide power from a main power bus of the vehicle to a subsystem of the vehicle such as an anti-lock brake system.

SUMMARY

In an embodiment, a charge pump circuit comprises a first charge pump and a second charge pump. The first charge pump may include an input terminal configured for receiving a supply voltage and boost the received supply voltage to provide at an output terminal of the first charge pump a first charge pump voltage. The second charge pump may include an input terminal coupled to the output terminal of the first charge pump for receiving the first charge pump voltage, and boost the received first charge pump voltage to provide at an output terminal of the second charge pump a second charge pump voltage. The second charge pump comprises a sequence of charge pump stages connected in series between the input and output terminals of the second charge pump. Each charge pump stage may be selectively enabled to boost an input stage voltage at a stage input terminal by a voltage corresponding to the supply voltage to provide at a stage output terminal a corresponding output stage voltage when the charge pump stage is enabled. Each charge pump stage may be selectively disabled to bring its corresponding stage output terminal to a high impedance state and is associated with a corresponding bypass unit comprising a first transistor configured to electrically couple the stage output terminal to the output terminal of the first charge pump when the charge pump stage is disabled. The bypass unit further comprises a second transistor connected in parallel to the first transistor and may be activated when the charge pump stage is disabled. The charge pump circuit further comprises a voltage drop sensing device configured to detect drops in the first charge pump voltage and to deactivate the second transistors of the bypass unit associated to the disabled charge pump stages when a drop in the first charge pump voltage is detected.

BRIEF DESCRIPTION OF THE DRAWINGS

Certain features of the disclosed technology are illustrated in various embodiments with reference to the attached drawings.

DETAILED DESCRIPTION

Figure 1A:
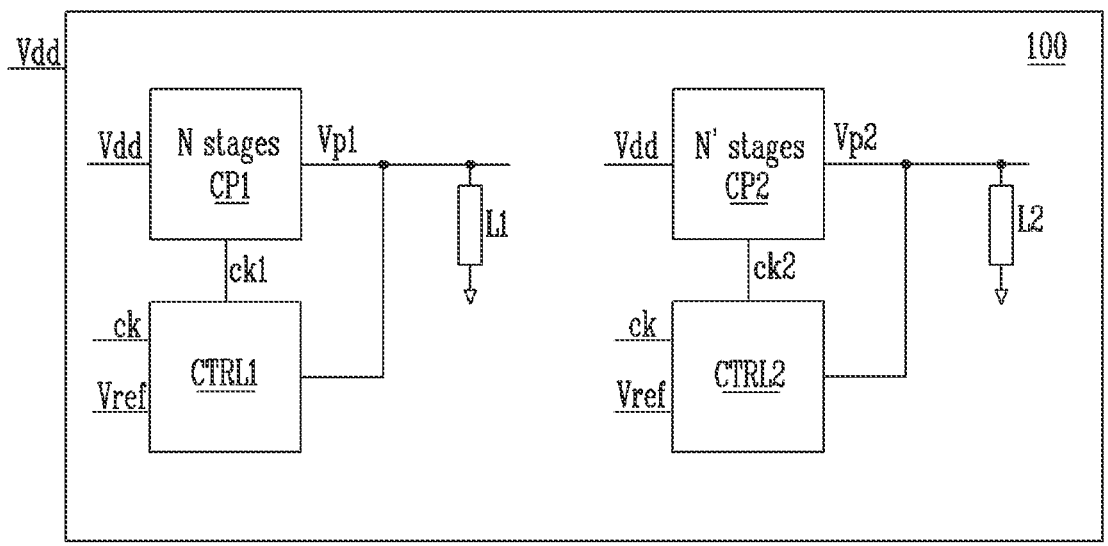
FIG. 1A illustrates a flash memory device comprising two charge pumps.

Charge pumps may manage voltages having large values, such as equal to several times the supply voltage. For this reason, the circuit of a typical charge pump is designed so that during the normal operation of the charge pump, the transistors thereof are subjected to voltage differences that are equal to only a fraction of these large voltages.

However, there are situations in which the voltage at some nodes of the charge pump are subjected to sudden drops, for example caused by sudden large requests of current from the load. These sudden voltage drops may be dangerous because they can cause a transistor of the charge pump to experience voltage differences higher than the maximum voltage difference they are designed to sustain without causing breakdown. This may happen for example when a terminal of a transistor included in a stage of the charge pump is subjected to a large voltage drop, while another terminal of the same transistor is still kept to a high voltage, for example because connected to a plate of a large boosting capacitor that is still charged.

In view of the above, various embodiments may provide a charge pump circuit designed to efficiently prevent or mitigate overvoltage issues.

According to various embodiments, it may be possible to increase the efficiency of the second charge pump without incurring in overvoltage issues caused by sudden large drops in the first charge pump voltage.

Indeed, in an embodiment, a charge pump efficiency is advantageously increased by providing in the bypass units thereof a second transistor in parallel to said first transistor and arranged to remove the voltage loss caused by the voltage threshold of the first transistor of each bypass unit, and at the same time potential overvoltage issues caused by sudden large drops in the first charge pump voltage that could propagate at the input terminal of a charge pump stage through said second transistor may be advantageously prevented or mitigated by a suitable and selective deactivation of said second transistors.

According to an embodiment, in each bypass unit the first transistor has a first conduction terminal connected to the output terminal of the first charge pump, a second conduction terminal connected to the stage output terminal of the corresponding charge pump stage, and a control terminal configured to be coupled to the output terminal of the first charge pump.

According to an embodiment, in each bypass unit the second transistor has a first conduction terminal connected to the first conduction terminal of the first transistor, a second conduction terminal connected to the second conduction terminal of the first transistor, and a control terminal configured to be coupled to the output terminal of the second charge pump.

According to an embodiment, each bypass unit further comprises a switch configured to cause the control terminal of the second transistor: to connect to the output terminal of the second charge pump, thereby activating the second transistor, when the charge pump stage associated to the bypass unit is disabled; and to connect to a reference terminal for deactivating the second transistor when the charge pump stage associated with the bypass unit is enabled.

According to an embodiment, the voltage drop sensing device is configured to drive the switch of each bypass unit associated with a disabled charge pump stage to cause the control terminal of the second transistor to be connected to the reference terminal also when a drop in the first charge pump voltage is detected.

According to an embodiment, the charge pump circuit further comprises a charge pump control unit configured to selectively enable/disable selected charge pump stages based on a desired value for the second charge pump voltage.

According to an embodiment, the charge pump control unit is configured to disable a set of selected charge pump stages of the sequence of charge pump stages.

According to an embodiment, said set of selected charge pump stages comprises a number of charge pump stages, said number being based on said desired value for the second charge pump voltage.

According to an embodiment, said set of selected charge pump stages comprises at least a first one of said sequence of charge pump stages.

According to an embodiment, said first one of said sequence of charge pump stages has the stage input terminal configured to be coupled to the output terminal of the first charge pump when the second charge pump is active.

According to an embodiment, said set of selected charge pump stages comprises a plurality of charge pump stages that are adjacent in said sequence of charge pump stages.

According to an embodiment, each charge pump stage comprises switches and at least one capacitor that is periodically charged and discharged by said switches under the control of a corresponding control signal that: oscillates following a clock signal when the charge pump stage is enabled; and is fixed to a constant value when the charge pump stage is disabled.

According to an embodiment, the charge pump circuit further comprises a bypass unit comprising a first transistor configured to electrically couple the output terminal of the first charge pump to an input terminal of a first one of said sequence of charge pump stages.

According to an embodiment, said voltage drop sensing device is configured to detect a drop in the first charge pump output voltage when the first charge pump output voltage drops under a corresponding voltage threshold.

According to an embodiment, each bypass unit comprises a further switch configured to cause the control terminal of the first transistor: to connect to the first conduction terminal of the first transistor when the second charge pump is active; and to connect to a reference terminal for deactivating the first transistor when the second charge pump is being turned off.

According to an embodiment, each switch is configured to cause the control terminal of the second transistor be connected to the reference terminal when the second charge pump is being turned off.

Various embodiments relate to a non-volatile semiconductor memory device comprising a charge pump circuit.

FIG. 1A illustrates a flash memory device, globally identified with reference 100, comprising a first charge pump CP1 and a second charge pump CP2. The flash memory device 100 is supplied by means of a supply voltage Vdd, for example generated by a battery (not illustrated).

The charge pump CP1 is configured to receive at an input terminal the supply voltage Vdd of the flash memory 100 and generate at an output terminal a corresponding charge pump output voltage Vp1 that is higher than the supply voltage Vdd.

Similarly, the charge pump CP2 is configured to receive at an input terminal the supply voltage Vdd of the flash memory device 100 and generate at an output terminal a corresponding charge pump output voltage Vp2 that is higher than the supply voltage Vdd.

The charge pump CP2 is configured to generate a charge pump voltage Vp2 that is higher than the charge pump output voltage Vp1.

The charge pump voltages Vp1 and Vp2 are exploited by the memory device 100 during the operations of the latter, and selectively provided to different loads, identified in FIG. 1A with reference L1 and L2, respectively, depending on the operations being carried out by the memory device 100.

For example, the charge pump voltage Vp1 may be used as a word line bias voltage to be provided to selected word lines (not illustrated) of the flash memory 100, while the charge pump voltage Vp2 (higher than the charge pump voltage Vp1) may be used to activate word line switches (not illustrated) to provide the word line bias voltage to the selected word lines. According to this example, the load L1 of the charge pump CP1 (i.e., the selected word lines) draws from the charge pump CP1 a relatively high amount of current, while the load L2 of the charge pump CP2 (i.e., the selected word line switches) draws from the charge pump CP2 a moderate amount of current (lower than the one drawn by the charge pump CP1).

The charge pumps CP1 and CP2 comprise each a corresponding sequence of charge pump stages (not illustrated in FIG. 1A), wherein each charge pump stage comprises switch elements and at least one capacitor that is periodically charged and discharged by the switch elements under the control of a clock signal, and particularly a clock signal ck1 for the charge pump stages of the charge pump CP1 and a clock signal ck2 for the charge pump stages of the charge pump CP2. The switch elements of the charge pump stages are implemented by low voltage MOS transistors. By "low voltage transistor" it is herein meant a transistor manufactured in such a way to be capable of sustaining, between pairs of terminals thereof, voltage differences lower than a predetermined voltage, for example depending on the supply voltage Vdd, such as for example voltage differences lower than 4 Volts. The word "predetermined" as used herein with respect to a parameter, such as a predetermined voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Each charge pump stage is configured to boost the voltage received at its input by an amount of about the supply voltage Vdd exploiting the transfer of electric charge implemented by the charging and discharging of the capacitors implemented by the switch elements under the control of the clock signals ck1, ck2. Particularly, the switch elements of a generic charge pump stage are configured to alternatively connect a positive terminal of a charge pump stage capacitor to the input terminal and to the output terminal of the same charge pump stage according to the clock signal oscillations. Moreover, the switch elements are also configured to alternatively connect a negative terminal of the charge pump stage capacitor to the supply voltage Vdd and to a ground voltage GND according to the clock signal oscillations.

The clock signal ck1 for the charge pump stages of the charge pump CP1 is generated by a corresponding charge pump control unit CTRLU starting from a main clock signal ck of the device 100 based on a reference voltage Vref and the charge pump output voltage Vp1. The charge pump control unit CTRL is configured to properly set the clock signal ck1 to regulate the value of the charge pump voltage Vp1 through a feedback loop according to the value of the received reference voltage Vref.

In the same way, the clock signal ck2 for the charge pump stages of the charge pump CP2 is generated by a corresponding charge pump control unit CTRL2 starting from the main clock signal ck of the device 100 based on the reference voltage Vref and the charge pump output voltage Vp2. The charge pump control unit CTRL2 is configured to properly set the clock signal ck2 to regulate the value of the charge pump voltage Vp2 through a feedback loop according to the value of the received reference voltage Vref.

The charge pump CP1 comprises a number N of charge pump stages, and the charge pump CP2 comprises a number N' of charge pump stages. Since each charge pump stage is configured to boost the voltage received at its input by a value of about the supply voltage Vdd, and since the charge pump CP2 is configured to generate a charge pump voltage Vp2 that is higher than the charge pump output voltage Vp1, the number N' of charge pump stages of the charge pump CP2 is generally larger than the number N of charge pump stages of the charge pump CP1.

Figure 1B:
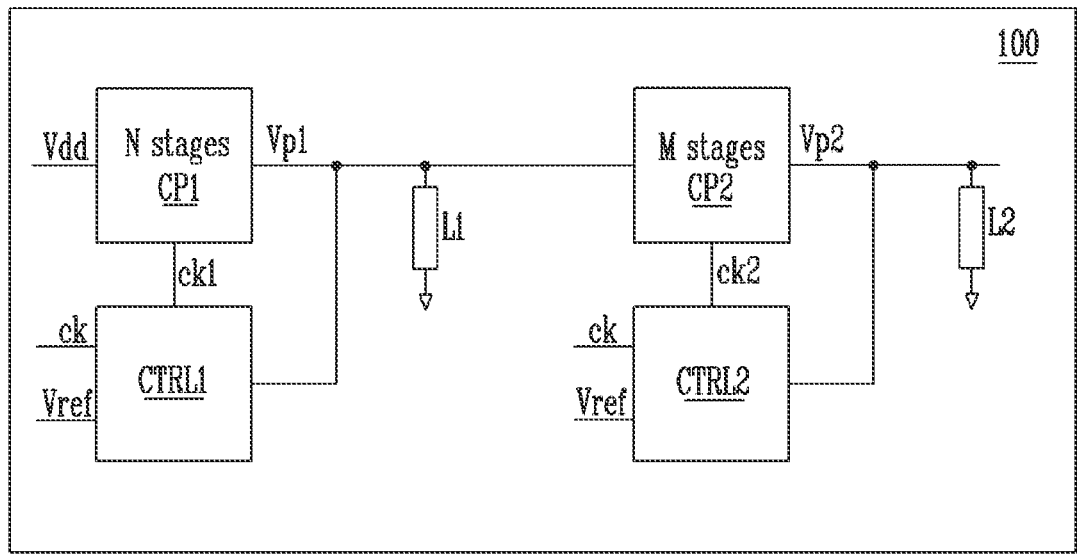
FIG. 1B illustrates a flash memory device comprising a charge pump circuit including two charge pumps in which the input of a charge pump is connected to the output of the other charge pump.

FIG. 1B illustrates a further charge pump circuit in which the input of the charge pump CP2 is connected to the output of the charge pump CP1 to receive (instead of the supply voltage Vdd) the charge pump voltage Vp1 generated by the charge pump CP1. The charge pump CP2 of the circuit of FIG. 1B requires a reduced number M of charge pump stages compared to the number N' of FIG. 1A to generate a same charge pump voltage Vp2, because in the circuit of FIG. 1B the input voltage to be boosted by the (sequence of charge pump stages of the) charge pump CP2 is already higher than the supply voltage Vdd.

Compared to the circuit of FIG. 1A, wherein the charge pump CP1 comprises N charge pump stages to generate the charge pump voltage Vp1 starting from the supply voltage Vdd, and the charge pump CP2 comprises N' charge pump stages to generate the charge pump voltage Vp2 starting from the supply voltage Vdd, in the circuit of FIG. 1B the same charge pump voltage Vp2 may be generated by the charge pump CP2 with a number M of charge pump stages equal to N-N'.

Figure 2A:
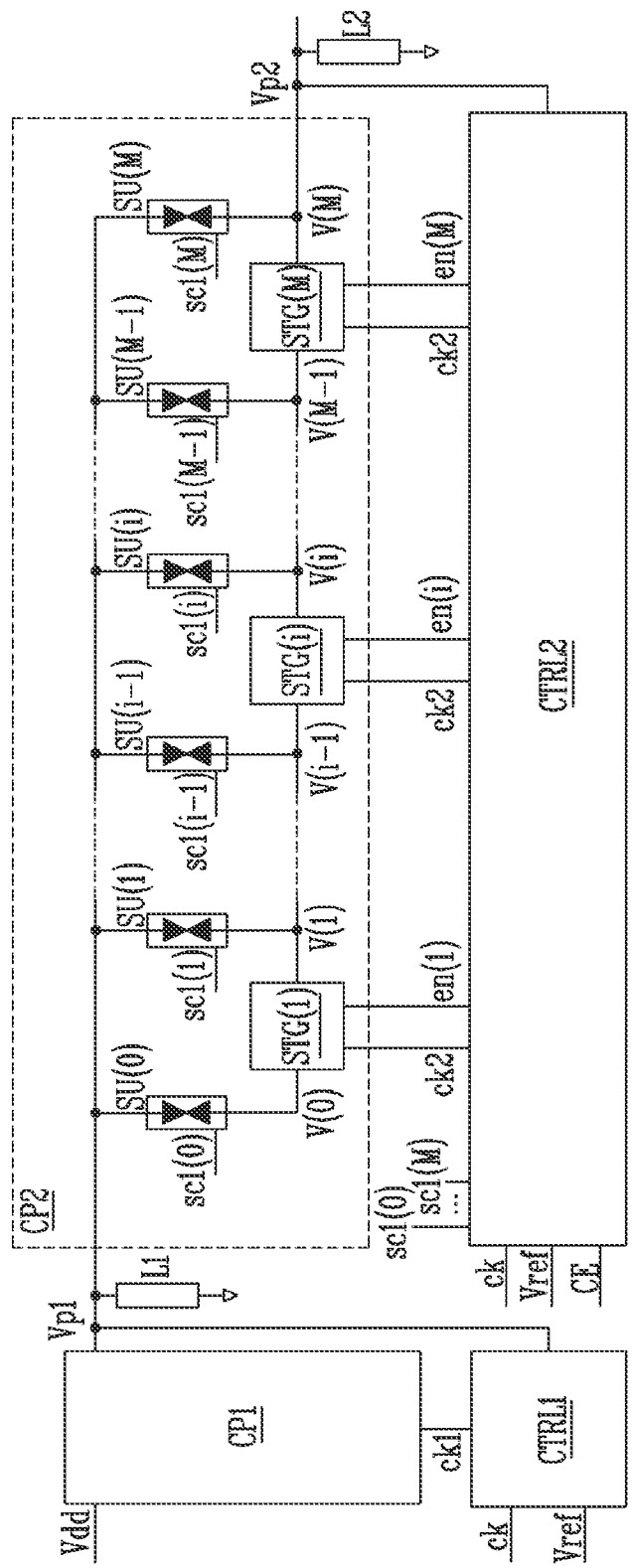
FIGS. 2A and 2B illustrate a charge pump circuit according to an embodiment.
Figure 2B:
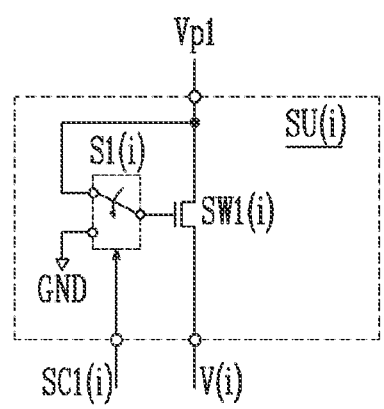

FIGS. 2A-2B illustrate a charge pump circuit according to an embodiment in which: the charge pump CP2 has its input connected to the output of the charge pump CP1 for receiving the charge pump voltage Vp1 (as in the circuit of FIG. 1B): and the charge pump stages of the charge pump CP2 may be selectively activated/deactivated to optimize charge pump current efficiency in function of the actual value of the charge pump voltage Vp2 to be generated by the charge pump CP2.

Particularly, the charge pump CP2 comprises a sequence of M charge pump stages STG(i) (i=1 to M) each one having an input terminal for receiving a corresponding voltage V(i−1) and an output terminal for providing a corresponding voltage V(i) generated by the charge pump stage STG(i) by boosting the voltage V(i−1) at its input terminal by (about) Vdd (when the charge pump stage STG(i) is enabled). In an embodiment, at least one of the sequence of M charge pump stages STG(i) (i=1 to M) may be selected as target charge pump stages. The input terminal of a generic charge pump stage STG(i) in the sequence different from the first charge pump stage STG(1) is connected to the output terminal of the preceding charge pump stage STG(i−1) in the sequence, so that the voltage V(i−1) provided at the input terminal of charge pump stage STG(i) is the voltage generated by the preceding charge pump stage STG(i−1). The input terminal of the first charge pump stage STG(1) is instead coupled to the input terminal of the charge pump CP2 (which is connected in turn to the output terminal of charge pump CP1), so that the voltage V(0) received by the first charge pump stage STG(1) corresponds to the charge pump voltage Vp1 generated by the charge pump CP1. The output terminal of the last charge pump stage STG(M) corresponds to the output terminal of the charge pump CP2, so that the charge pump voltage Vp2 generated by the charge pump CP2 corresponds to the voltage V(M) generated by the charge pump stage STG(M) and provided at its output terminal.

Each charge pump stage STG(i) has a clock terminal for receiving the clock signal ck2 from the charge pump control unit CTRL2. Moreover, each charge pump stage STG(i) has an enable terminal for receiving a corresponding enable signal en(i) from the charge pump control unit CTRL2. Each charge pump stage STG(i) may be selectively enabled/disabled based on the value assumed by the corresponding enable signal en(i).

When the enable signal en(i) is set to an enabling value (for example to a logic value "1" corresponding to the supply voltage Vdd), the charge pump stage STG(i) is enabled to boost the voltage V(i−1) received at its input terminal to generate at its output terminal a voltage V(i) corresponding to about V(i−1)+Vdd.

When the enable signal en(i) is set to a disabling value (for example to a logic value "0" corresponding to a ground voltage GND), the charge pump stage STG(i) is disabled, and no boost of the voltage V(i−1) received at its input terminal is carried out, with the output terminal thereof that goes to a high impedance state.

For example, the charge pump stage STG(i) may be configured so that the periodic charging/discharging of the at least one capacitor of the charge pump stage STG(i) caused by the oscillations of the clock signal ck2 can be selectively enabled/disabled according to the value of the enable signal en(i).

For example, the charge pump stage STG(i) may be configured to control said periodic charging/discharging of the capacitor(s) using a control signal that: oscillates following the received clock signal ck2 when the enable signal en(i) is at the enabling value: and is fixed to a constant value when the enable signal en(i) is at the disabling value.

The enable signals en(i) may be generated by the charge pump control unit CTRL2 according to an enable digital word CE provided to the charge pump control unit CTRL2.

According to an embodiment, the charge pump CP2 comprises for each charge pump stage STG(i) a corresponding bypass unit SU(i) configured to selectively couple the output terminal of the corresponding charge pump stage STG(i) to the input terminal of the charge pump CP2 when the charge pump stage STG(i) is disabled. The bypass units SU(i) are configured to decouple the output terminal of the corresponding charge pump stage STG(i) from the input terminal of the charge pump CP2 when the charge pump stage STG(i) is enabled.

According to an embodiment illustrated in FIG. 2B, each bypass unit SU(i) comprises a high voltage NMOS transistor SW1(i) having a first conduction (e.g., drain) terminal connected to the input terminal of the charge pump CP2 for receiving the charge pump voltage Vp1 generated by the charge pump CP1, a second conduction (e.g., source) terminal connected to the output terminal of the corresponding charge pump stage STG(i) providing the voltage V(i), and a gate (e.g., control) terminal that can be coupled to the first conduction terminal to bring the transistor SW1(i) in a diode-connected circuit.

By "high voltage transistor" it is herein meant a transistor manufactured in such a way to be capable of sustaining, between pairs of terminals thereof, voltage differences higher than a predetermined voltage, for example depending on the supply voltage Vdd, such as for example voltage differences higher than 4 Volts.

When a charge pump stage STG(i) is enabled, the diode-connected transistor SW1(i) of the corresponding bypass unit SU(i) is reverse-biased, since its second conduction terminal is at a voltage V(i) that is higher than the voltage Vp1 at its first conduction terminal. Therefore, the output terminal of the charge pump stage STG(i) is electrically decoupled from the input terminal of the charge pump CP2.

When a charge pump stage STG(i) is disabled, the diode-connected transistor SW1(i) of the corresponding bypass unit SU(i) is forward-biased, and the output terminal of the charge pump stage STG(i) is electrically coupled to the input terminal of the charge pump CP2, so that the voltage V(i) at the output terminal of the charge pump stage STG(i) is brought to Vp1-Vth1, wherein Vth1 is the threshold voltage of the transistor SW1(i).

According to an embodiment, a bypass unit SU(0), identical to other bypass units SU(i) with i>0, is also provided, configured to selectively couple the input terminal of charge pump CP2, being also the output terminal of charge pump CP1 to the input terminal of the first charge pump stage STG(1) of charge pump CP2.

According to an embodiment, the charge pump stages STG(i) of the charge pump CP2 are selectively activated/deactivated (through the respective enable signals en(i)) based on a value (magnitude) of the charge pump voltage Vp2 in the following way.

A range for the charge pump voltage Vp2 is defined, having a lower end Vp2(l) corresponding to about the charge pump voltage Vp1, and a upper end Vp2(u) higher than the charge pump voltage Vp1.

When the charge pump CP2 has to output a charge pump voltage Vp2 having a value corresponding to the upper end Vp2(u) of the charge pump voltage range, all the enable signals en(i) are set to the enabling value, enabling all the charge pump stages STG(i). In this situation, the diode-connected transistors SW1(i) of all the bypass units SU(i) with i>0 are reverse-biased, and the output terminals of the charge pump stages STG(i) are electrically decoupled from the input terminal of the charge pump CP2. The diode connected transistor SW1(i) of the bypass unit SU(i) with i=0 is on the contrary forward biased and voltage V(0) at input of charge pump stage STG(1) is therefore equal to Vp1-Vth1.

When the charge pump CP2 has to output a charge pump voltage Vp2 having a value lower than the upper end Vp2(u) of the charge pump voltage range, one or more charge pump stages STG(i) may be disabled, starting from the first charge pump stage STG(1) and progressively proceeding along the sequence of charge pump stages STG(i) towards the last charge pump stage STG(M) as the value of the charge pump voltage Vp2 decreases towards the lower end Vp2(l) of the charge pump voltage range. In this situation, the diode-connected transistors SW1(i) of the bypass units SU(i) corresponding to the disabled charge pump stages STG(i) are forward biased, clamping the voltages V(i) at their output terminals to Vp1-Vth1.

The diode connected transistor SW1(i) of the bypass unit SU(i) with i=4) is also forward biased and voltage V(0) at input terminal of charge pump stage STG(1) is therefore equal to Vp1-Vth1.

In this way, for disabled charge pump stages, there is no difference between the voltage at the input terminal and the voltage at the output terminal, being both biased at Vp1-Vth1.

Generally, when the charge pump CP2 has to output a charge pump voltage Vp2 having a value comprised between the lower end Vp2(1) and the upper end Vp2(u) of the charge pump voltage range: the charge pump stages STG(i) (i=K to M) in the sequence of charge pump stages STG(i) are enabled; and the charge pump stages STG(i) (i=1 to K−1) in the sequence of charge pump stages STG(i) are disabled, and the voltages V(i) at their output terminals are clamped to Vp1-Vth1 by the bypass units SU(i) (if K=1, no charge pump stages STG(i) are disabled), with K that ranges: from a value equal to 1 (all the charge pump stages STG(i) are enabled) in case the charge pump CP2 has to output a charge pump voltage Vp2 having a value corresponding to the upper end Vp2(u) of the charge pump voltage range: and to a value equal to M (only the last charge pump stage STG(M) is enabled) in case the charge pump CP2 has to output a charge pump voltage Vp2 having a value corresponding to the lower end Vp2(l) of the charge pump voltage range.

Similar considerations apply in case the highest value for K (corresponding to the case in which the charge pump voltage Vp2 has a value corresponding to the lower end Vp2(l) of the charge pump voltage range) is lower than M (meaning that a number higher than 1 of charge pump stages STG(i) is always enabled).

By varying the number of enabled charge pump stages STG(i) depending on the charge pump voltage Vp2, while clamping the voltages V(i) at the output terminals of the disabled charge pump stages STG(i), it is therefore possible, in an embodiment, to optimize the current efficiency of the charge pump CP2.

When the charge pump CP2 is being turned off, the output terminals of the charge pump stages STG(i) discharges during a so-called "charge pump CP2 discharge operation". If the diode-connected transistors SW1(i) of the bypass units SU(i) corresponding to one or more charge pump stages STG(i) are forward biased, meaning that the output terminals of said charge pump stages STG(i) are electrically coupled to the input terminal of the charge pump CP2, which is in turn connected to the output terminal of the charge pump CP1, a discharge of the output terminals of these charge pump stages STG(i) would cause in turn a discharge of the output terminal of the charge pump CP1 across said forward biased transistors SW1(i). In other words, during the charge pump CP2 discharge operation, the voltage Vp1 at the output terminal of the charge pump CP1 would decrease.

In order to avoid this drawback, according to an embodiment the bypass units SU(i) (i=0, 1, . . . , M) are configured to turn off the transistors SW1(i) during the charge pump CP2 discharge operation to electrically decouple the input terminal of the charge pump CP2 (and therefore, the output terminal of the charge pump CP1) from the output terminals of the charge pump stages STG(i).

For this reason, according to an embodiment, each bypass unit SU(i) comprises a switch S1(i) controlled by a respective control signal SC1(i) generated by the charge pump control unit CTRL2, and configured to selectively turn off the transistor SW1(i) during the charge pump CP2 discharge operation.

The switch S1(i) has a first conduction terminal connected to the gate terminal of the transistor SW1(i), a second conduction terminal connected to the first conduction terminal (drain) of the transistor SW1(i), and a third conduction terminal connected to a terminal providing the ground voltage GND.

The switch S1(i) is configured to: electrically couple its first conduction terminal to its second conduction terminal when the control signal SC1(i) is set to a first value (for example to a logic value "1" corresponding to the supply voltage Vdd) indicative of a charge pump CP2 normal operation; and electrically couple its first conduction terminal to its third conduction terminal when the control signal SC1(i) is set to a second value (for example to a logic value "0" corresponding to the ground voltage GND) indicative of that a charge pump CP2 discharge operation is being carried out.

During the normal operation of the charge pump CP2, the control signals SC1(i) are set to the first value so that the switches S1(i) connect the gate terminals of the transistors SW1(i) to the first conduction terminals of the transistors SW1(i), allowing thus an operation of the transistors SW1(i) in the diode-connected circuit already described above.

During the charge pump CP2 discharge operation, in an embodiment, the control signals SC(i) are set to the second value so that the transistors SW1(i) are turned off, advantageously avoiding undesired discharging of the output terminal of the charge pump CP1 across the transistors SW1(i).

Due to the circuit including the switch S1(i) illustrated in FIG. 2B, the voltage Vp1 at the output terminal of the charge pump CP1 is, in an embodiment, advantageously not affected by the voltage decreasing of the voltages V(i) during the charge pump CP2 discharge operation.

As it should be clear from description above, with the embodiment of the disclosure depicted in FIGS. 2A and 2B the voltage at the input terminal of first enabled stage STG(i) of charge pump CP2 is always Vp1-Vth. In an embodiment, this voltage level is important and it should be maximized as it is the base level used to generate the charge pump voltage VP2 output by the charge pump CP2 by capacitive pumping in each stage STG(i).

In an embodiment, in order to increase the charge pump CP2 efficiency, the voltage at the input terminal of first enabled stage STG(i) of charge pump CP2 should be as closer as possible to Vp1. Moreover, if transistors SW(i) inside bypass units SU(i) are not triple-well transistors, their threshold voltage Vth might be quite high (~1V or above) due to transistors SW(i) body effect, bringing the voltage at the input of the first enabled stage STG(i) of the charge pump CP2 at a level quite lower than Vp1.

As a result, in an embodiment, the level of the charge pump voltage Vp2 output by the charge pump CP2 might be lower than expected, and an increase of the number of charge pump stages STG(i) of charge pump CP2 would be needed to match the maximum output voltage requirement of charge pump CP2, thus decreasing charge pump overall power efficiency.

Figure 3A:
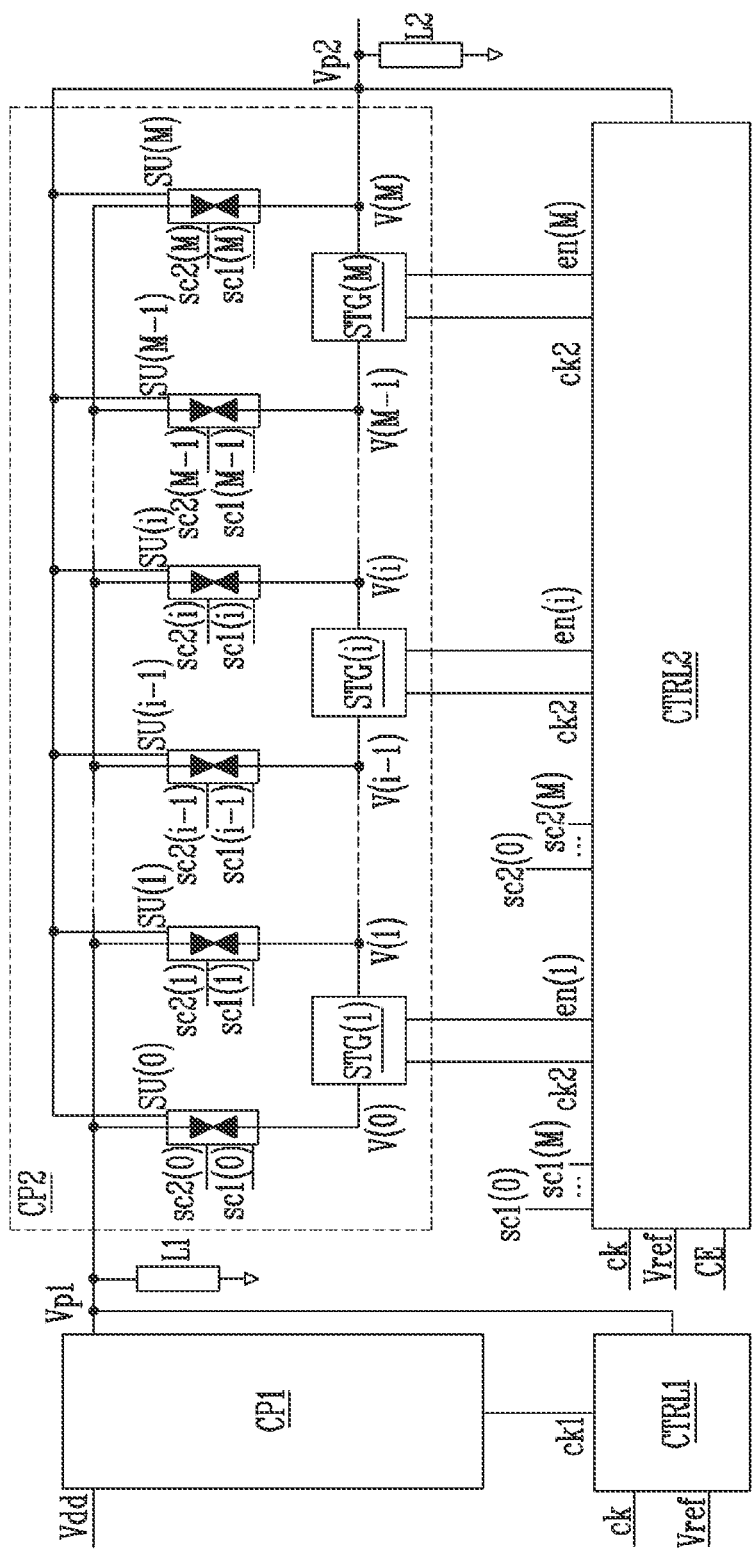
FIGS. 3A and 3B illustrate a charge pump circuit according to an embodiment.
Figure 3B:
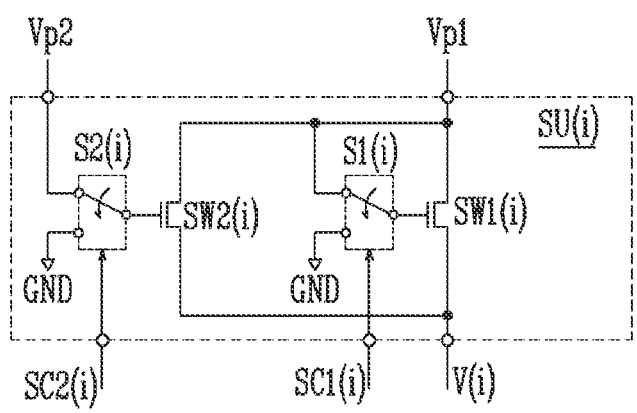

This feature may be avoided, or at least mitigated, by another embodiment depicted in FIGS. 3A and 3B.

Compared to the charge pump circuit of FIGS. 2A-2B, in which the voltages V(i) at the output terminals of disabled charge pump stages STG(i) and the voltage V(0) at the input of charge pump stage STG(0) are brought to Vp1-Vth1 by the forward biased diode-connected transistors SW1(i) of the corresponding bypass units SU(i), in the charge pump circuit of FIGS. 3A-3B the voltages V(i) at the output terminals of disabled charge pump stages STG(i) and the voltage V(0) at the input of charge pump stage STG(0) are brought to Vp1. In this way, by removing the voltage loss of Vth1 at each charge pump stage STG(i), in an embodiment, the efficiency of the charge pump CP2 may be improved.

For this purpose, each bypass unit SU(i) is modified to include another transistor SW2(i) having a first conduction terminal (drain) connected to the first conduction terminal of the transistor SW1(i), a second conduction terminal (source) connected to the second conduction terminal of the transistor SW1(i), and a gate (e.g., control) terminal that can be selectively coupled to: the output terminal of the charge pump CP2 for receiving the charge pump voltage Vp2 during the charge pump CP2 normal operation if the charge pump stage STG(i) is disabled; a terminal providing the ground voltage GND during the normal charge pump CP2 operation if the charge pump stage STG(i) is enabled and during the charge pump CP2 discharge operation.

For this reason, each bypass unit SU(i) comprises a switch S2(i) controlled by a respective control signal SC2(i) generated by the charge pump control unit CTRL2, and comprising a first conduction terminal connected to the gate terminal of the transistor SW2(i), a second conduction terminal connected to the output terminal of the charge pump CP2 for receiving the charge pump voltage Vp2 and a third conduction terminal connected to a terminal providing the ground voltage GND.

The switch S2(i) is configured to: electrically couple its first conduction terminal to its second conduction terminal when the control signal SC2(i) is set to a first value (for example to a logic value "1" corresponding to the supply voltage Vdd); and electrically couple its first conduction terminal to its third conduction terminal when the control signal SC2(i) is set to a second value (for example to a logic value "0" corresponding to the ground voltage GND).

During the normal operation of the charge pump CP2, the control signals SC1(i) of all the bypass units SU(i) are set to the first value so that each transistor SW1(i) is in the diode configuration.

Moreover, during the normal operation of the charge pump CP2, the control signal SC2(i) of each bypass units SU(i) corresponding to an enabled charge pump stage STG (i) is set to the second value so that the corresponding transistor SW2(i) is off, and the corresponding (diode-connected) transistor SW1(i) is on and reverse-biased. In this way, the voltage V(i) at the output terminal of the charge pump stage STG(i) is boosted by the charge pump stage STG(i) to V(i−1)+Vdd (as in the case illustrated in FIGS. 2A-2B).

Furthermore, during the normal operation of the charge pump CP2, the control signal SC2(i) of each bypass units SU(i) corresponding to a disabled charge pump stage STG(i) is set to the first value. Therefore, the corresponding transistor SW2(i) is on, because during the normal operation of the charge pump CP2, the charge pump voltage Vp2 is higher than the charge pump voltage Vp1 plus the threshold voltage Vth2 of the transistor SW2(i). In this way, the voltage V(i) at the output terminal of the charge pump stage STG(i) is brought to Vp1 (and not to Vp1-Vth1, as in the circuit of FIGS. 2A-2B), and the transistor SW1(i) is off.

Moreover, the control signal SC2(0) of the bypass unit SU(0) is always on during the normal operation of the charge pump CP2, so that also the voltage V(0) at the input terminal of the charge pump stage STG(1) is brought to Vp1 (and not to Vp1-Vth1, as in the circuit of FIGS. 2A-2B), and the transistor SW1(0) is off.

Therefore, according to an embodiment disclosed in FIGS. 3A and 3B, the level of the voltage at the input of the first enabled charge pump stage STG(i) of charge pump CP2 is higher than the one of the embodiment associated with FIGS. 2A and 2B being Vp1 instead of (Vp1-Vth). As a result, in an embodiment, the charge pump CP2 can be optimized in terms of power efficiency as it can be designed with the minimum number of stages required to satisfy an output value requirement.

During the charge pump CP2 discharge operation, the control signals SC1(i) of all the bypass units SU(i) are set to the second value so that each transistor SW1(i) is in off condition.

Moreover, during the charge pump CP2 discharge operation, the control signals SC2(i) of all the bypass units SU(i) are also set to the second value so that each transistor SW2(i) is also in off condition.

Being all internal nodes of charge pump CP2 (i.e., the input and output terminals of the charge pump stages STG(i) thereof) thus disconnected from charge pump CP1 during the charge pump CP2 discharge operation, in an embodiment, the charge pump CP2 can be discharged while not affecting (i.e., discharging) charge pump CP1.

It should be noted the behavior of charge pump CP2 also in the case of output sudden drop due to a variation in the load L2. When this situation happens (during the normal operation of the charge pump CP2), the output voltage Vp2 of charge pump CP2 might drop to a voltage value lower than the charge pump voltage Vp1 plus the threshold voltage Vth2 of the transistors SW2(i). Therefore, the transistors SW2(i) of the disabled charge pump stages STG(i) might turn off. However, the diode-connected transistors SW1(i) of the disabled charge pump stages STG(i) turn on becoming forward biased. In this situation, electric charge is provided to the input terminal of the first enabled charge pump stage STG(i) stage of CP2. In this way, the voltages at the output terminals of the disabled charge pump stages STG(i) are brought to Vp1-Vth1.

The charge pump circuit of FIGS. 3A-3B is affected by overvoltage issues that may cause breakdown of components of the first enabled charge pump stage STG(i) in the sequence of the charge pump stages STG(i) of the charge pump CP2 when the charge pump voltage Vp1 is subjected to sudden large drops, for example because of a sudden large variation in the load L1.

Particularly, by making reference to a generic case in which: the charge pump stages STG(i) (i=1 to K) in the sequence of charge pump stages STG(i) are disabled; and the charge pump stages STG(i) (i=K+1 to M) in the sequence of charge pump stages STG(i) are enabled.

Figure 3C:
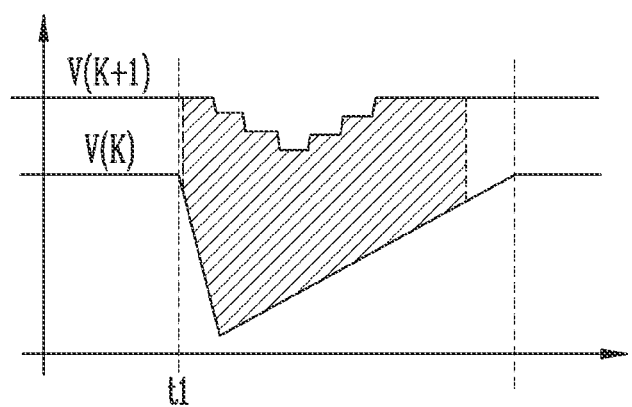
FIG. 3C illustrates an example of an evolution in time of voltages of the charge pump circuit of an embodiment associated with FIGS. 3A and 3B.

FIG. 3C illustrates an example of an evolution in time of the voltage V(K) at the output terminal of the last disabled charge pump stage STG(K) and of the voltage V(K+1) at the output terminal of the first enabled charge pump stage STG(K+1) before, during, and after a sudden drop in the charge pump voltage Vp1 is experienced. In FIG. 3C, the X-axis indicates time in seconds and the Y-axis indicates voltage levels.

As already described with reference to FIG. 3B, the control signals SC1(K) and SC2(K) of the bypass unit SU(K) of the disabled charge pump stage STG(K) are both set to the first value (logic "1"), so that the corresponding transistor SW2(K) is on, because the charge pump voltage Vp2 is higher than the charge pump voltage Vp1 plus the threshold voltage Vth2 of the transistor SW2(K). In this way, the voltage V(K) at the output terminal of the charge pump stage STG(K) is brought to Vp1, and the transistor SW1(K) is off.

Moreover, the control signal SC1(K+1) of the bypass unit SU(K+1) of the enabled charge pump stage STG(K+1) is set to the first value (logic "I"), and the control signal SC2(K+1)

of the bypass unit SU(K+1) is set to the second value (logic "0"), so that the corresponding transistor SW2(K+1) is off, and the corresponding (diode-connected) transistor SW1(K+1) is in diode configuration. In this way, the voltage V(K+1) at the output terminal of the charge pump stage STG(K+1) is boosted by the charge pump stage STG(K) to V(K)+Vdd.

At time t1 (see FIG. 3C), a sudden drop of the charge pump voltage Vp1 at the output terminal of charge pump CP1 occurs. Since the output terminal of the charge pump stage STG(K) is coupled to the output terminal of the charge pump CP1 through the (activated) transistor SW2(K) of the bypass unit SU(K), the voltage V(K) at the output terminal of the charge pump stage STG(K) follows the drop in the charge pump voltage Vp1.

Since the charge pump stage STG(K+1) is enabled, at time t1 the internal capacitor(s) of said charge pump stage STG(K+1) are still charged (to a value corresponding to a voltage that is a multiple of Vdd). Therefore, while the voltage V(K) at the output terminal of the disabled charge pump stage STG(K) immediately follows the drop in the charge pump voltage Vp1, the voltage V(K+1) at the output terminal of the charge pump stage STG(K+1) does not immediately drop, as the discharging of the capacitor(s) of this stage needs some time. Therefore, the difference between the voltage V(K) at the input terminal of the charge pump stage STG(K+1) and the voltage V(K+1) at the output terminal of the charge pump stage STG(K+1) accordingly increases.

If the charge pump voltage Vp1 decreases by an excessive amount (overvoltage condition), the voltage difference experienced by the transistors of the charge pump stage STG(K+1) may exceed the maximum voltage difference said transistors are capable of sustaining, and said transistors may break. This drawback is exacerbated by the fact that the transistors of the charge pump stage STG(K+1) are low voltage transistors, and therefore they are capable of sustaining relatively low voltage differences.

It is pointed out that while conventional charge pumps are protected against overvoltage conditions caused by voltage drops at the output terminal of their charge pump stages through corresponding protecting diodes, said protecting diodes cannot be employed to protect against overvoltage conditions caused by voltage drops at the input terminal of a charge pump stage (as the voltage drop at the input terminal of charge pump stage STG(K+1)), since such a protecting diode would limit the voltage boosting efficiency of the charge pump stage.

It is also underlined that the abovementioned overvoltage issue caused by voltage drops at the input terminal of an enabled charge pump stage may happen only if the charge pump stage belongs to a charge pump receiving at its input terminal a voltage that can be subjected to sudden drops, like the charge pump CP2, whose input terminal receives the charge pump voltage Vp1 generated by the charge pump CP1. A conventional charge pump receiving at its input the supply voltage Vdd is not affected by overvoltage issues of this kind.

According to an embodiment, the overvoltage issue caused by a drop in the charge pump voltage Vp1 is overcome by temporarily turning off the transistors SW2(i) of the bypass units SU(i) of the disabled charge pump stages STG(i) (i=0 to K) interrupting thus the direct electric connection between the output terminal of the disabled charge pump stages STG(i) and the output terminal of the charge pump CP1, when a sufficiently large charge pump voltage Vp1 decrease is detected.

In this way, the voltage V(K) at the output terminal of the last disabled charge pump stage STG(K) is no longer brought to the charge pump voltage Vp1 by the transistor SW2(K). Both transistors SW1(K) and SW2(K) of the bypass unit SU(K) of the last disabled stage STG(K) are thus in an off state suddenly after the drop of the charge pump voltage Vp1. Since the charge pump CP2 is delivering current to load L2, the voltages V(i) at the output terminals of the charge pump stages STG(i) (1=K to M) will decrease, being the voltage V(K) at the input terminal of the first enabled stage STG(K+1) of the charge pump CP2 in a floating state. As soon as the voltage V(K) decreases to a level below Vp1-Vth, transistor SW1(K) turns-on, starting to deliver current to the first enabled charge pump stage STG(K+1). In this way, the voltages V(i) at the output terminals of the charge pump stages STG(i) (i=K to M) increase toward their stationary level (i.e., the steady level taken during the normal operation of the charge pump CP2 in absence of large perturbations). It should be understood from above description that during this transient also charge pump CP1 recovers from the charge pump voltage Vp1 drop by re-adjusting the charge pump voltage Vp1 level to its stationary level.

Figure 4A:
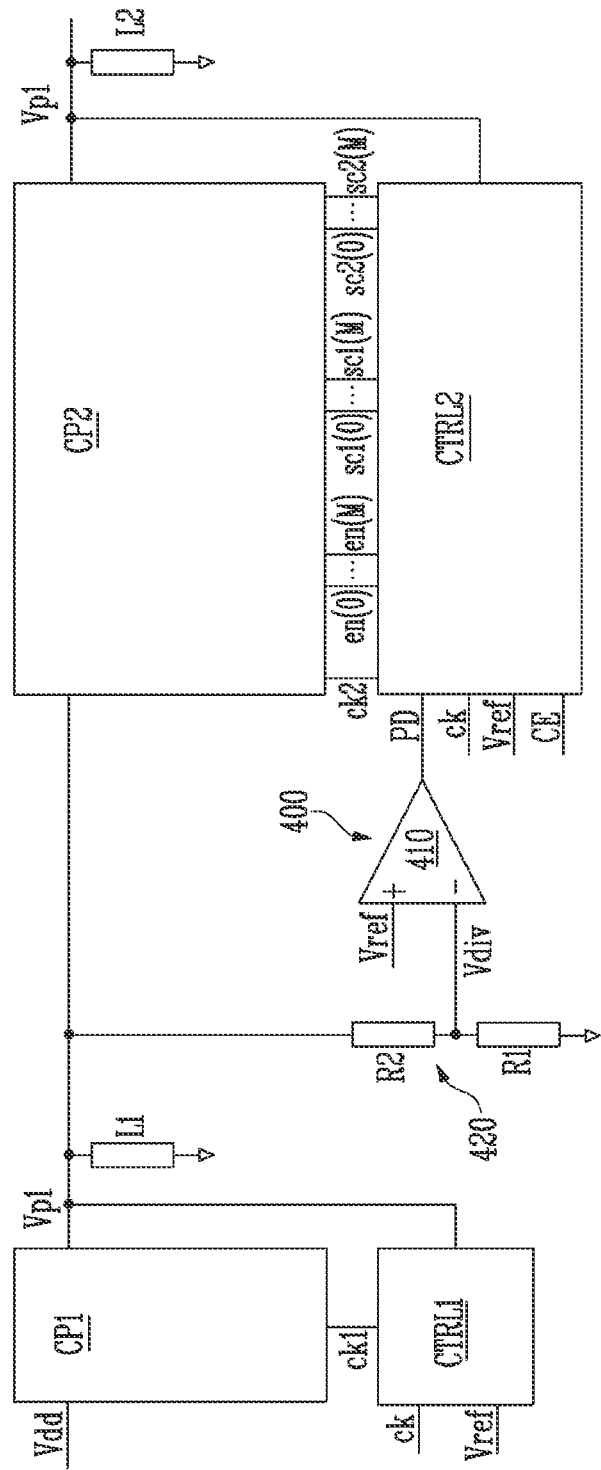
FIG. 4A illustrates a charge pump circuit according to an embodiment.

For this reason, according to an embodiment illustrated in FIG. 4A, a charge pump voltage drop sensing device 400 is provided, configured to detect when the charge pump voltage Vp1 at the output terminal of the charge pump CP1 (and therefore at the input terminal of the charge pump CP2) drops under a voltage threshold Vp1 TH (for example corresponding to 90% of a desired value for the charge pump voltage Vp1).

In the embodiment illustrated in FIG. 4A, the charge pump voltage drop sensing device 400 comprises a comparator 410 having a non-inverting input terminal configured to receive the reference voltage Vref, an inverting input terminal connected to a center tap of a voltage divider 420 for receiving a divider voltage Vdiv depending on the charge pump voltage Vp1 and an output terminal for providing a corresponding detection signal PD to the charge pump control unit CTRL2.

In the embodiment illustrated in FIG. 4A, the voltage divider 420 comprises a first resistor R1 connected between a terminal providing the ground voltage GND and the inverting input terminal of the comparator 410, and a second resistor R2 connected between the inverting input terminal of the comparator 410 and the output terminal of the charge pump CP1 for receiving the charge pump voltage Vp1.

According to an embodiment, the resistances of the resistors R1 and R2 are set in such a way that the divider voltage Vdiv is equal to Vref when the charge pump voltage Vp1 is equal to the voltage threshold Vp1TH.

In this way, as long as the charge pump voltage Vp1 is higher than the voltage threshold Vp1TH, the detection signal PD is at a low value. When the charge pump voltage Vp1 drops under the voltage threshold Vp1TH, the detection signal PD switches to a high value.

According to an embodiment, the charge pump control unit CTRL2 is configured to set the control signals SC2(i) of the bypass units SU(i) corresponding to the disabled charge pump stage STG(i) (i=1 to K) to the second value ("logic 0") for turning off the corresponding transistors SW2(i) when the detection signal PD is to the high value, and set back again said control signals SC2(i) to the first value ("logic I") for turning on again the corresponding transistors SW2(i) when the detection signal PD is to the low value.

In this way, in an embodiment, the direct electric connection between the output terminal of the disabled charge pump stages STG(i) (i=1 to K) and the output terminal of the charge pump CP1 is prevented or mitigated when a sufficiently large charge pump voltage Vp1 decrease is detected, preventing or mitigating thus that the transistors of the first enabled charge pump stage STG(K+1) experience excessive voltage differences.

Figure 4B:
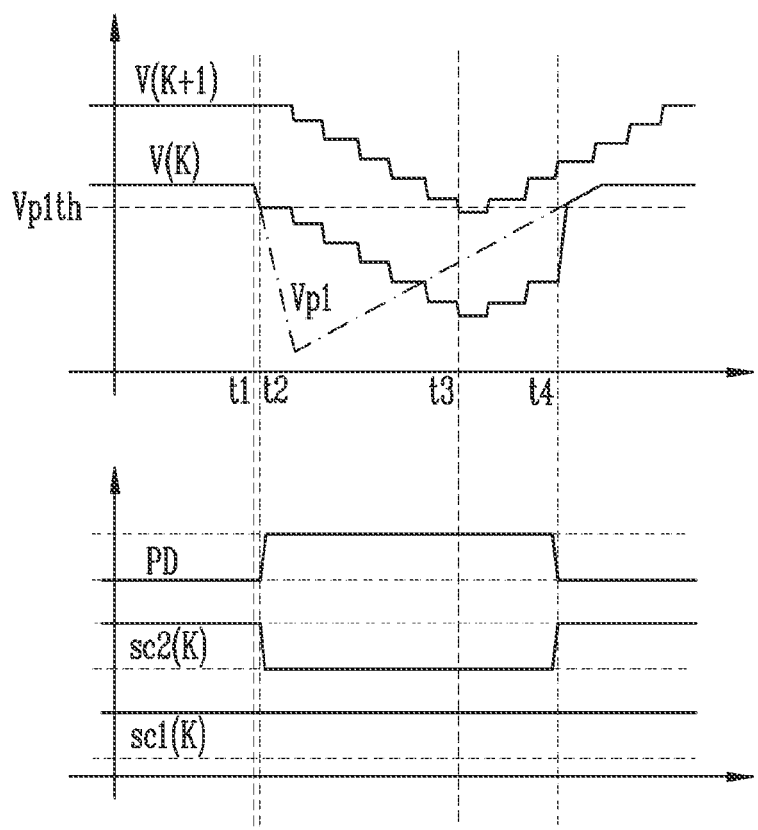
FIG. 4B illustrates an example of an evolution in time of voltages of the charge pump circuit of an embodiment associated with FIG. 4A.

Particularly, by making reference to the example scenario of FIG. 4B, showing an example of an evolution in time of voltages of signals and circuit node of the charge pump circuit of FIG. 4A during a drop in the charge pump voltage Vp1 according to an embodiment. In FIG. 4B, the X-axis indicates time in seconds and the Y-axis indicates voltage levels.

As in the example considered in FIG. 3C, the charge pump stages STG(i) (i=1 to K) of the charge pump CP2 are disabled, while the following charge pump stages STG(i) (i=K+1 to M) of the charge pump CP2 has the stages STG(i) (i=1 to K) are enabled.

The initial configuration provides that the control signals SC1(K) and SC2(K) of the bypass unit SU(K) of the last disabled charge pump stage STG(K) are both set to the first value (logic "1"), so that the corresponding transistor SW2(K) is on, because the charge pump voltage Vp2 is higher than the charge pump voltage Vp1 plus the threshold voltage Vth2 of the transistor SW2(K). In this way, the voltage V(K) at the output terminal of the charge pump stage STG(K) is brought to Vp1, and the transistor SW1(K) is off. Furthermore, the control signal SC1(K+1) of the bypass unit SU(K+1) of the first enabled charge pump stage STG(K+1) is set to the first value (logic "1"), and the control signal SC2(K+1) of the bypass unit SU(K+1) is set to the second value (logic "0"), so that the corresponding transistor SW2(K+1) is off, and the corresponding (diode-connected) transistor SW1(K+1) is in diode configuration. In this way, the voltage V(K+1) at the output terminal of the charge pump stage STG(K+1) is boosted by the charge pump stage STG(K) to V(K)+Vdd.

Moreover, the initial configuration provides that the charge pump voltage Vp1 generated by charge pump CP1 is higher than the voltage threshold Vp1TH, and therefore the detection signal PD is at the low value.

At time t1, a sudden drop of the charge pump voltage Vp1 at the output terminal of charge pump CP1 occurs. Since the output terminal of the charge pump stage STG(K) is coupled to the output terminal of the charge pump CP1 through the (activated) transistor SW2(K) of the bypass unit SU(K), the voltage V(K) at the output terminal of the charge pump stage STG(K) follows the drop in the charge pump voltage Vp1.

At time t2, the charge pump voltage Vp1 falls below the voltage threshold Vp1TH, and therefore the detection signal PD switches from the second value to the first value. Thus, the control signals SC2($i$) of the bypass units SU(i) corresponding to the disabled charge pump stage STG(i) (i=1 to K) are switched to the second value for turning off the corresponding transistors SW2($i$). In this way, the voltages V(i) at the output terminals of charge pump stages STG(i) (i=1 to K) do not follow the charge pump voltage VP1 but rather become floating at a high impedance state. In particular, from time t2, the output terminal of the last disabled charge pump stage STG(K), which is also the input terminal of the first enabled charge pump stage STG(K+1) becomes floating, and the voltage V(K) at the input of the first enabled charge pump stage STG(K+1) ceases to directly follow the drop in the charge pump voltage VP1.

Since the charge pump stages STG(i) (i=K+1 to M) of charge pump CP2 are enabled, and they operate to deliver current to load L2, but at the same time the input terminal of the first enabled charge pump stage STG(K+1) is floating (i.e., it is not receiving new electric charge), the voltage V(K) will decrease following the charge requests of the following charge pump stages STG(i) (i=K+1 to M). Each of the voltages V(i+1) of the following charge pump stages STG(i+1) (i=K to M−1) will decrease accordingly, being equal to about V(i)+Vdd. For example, as illustrated in FIG. 4B, the voltage V(K+1) decreases as the voltage V(K), with a difference of about Vdd.

The decreasing of voltages V(i) (i=K to M) continues until voltage V(K) falls below Vp1-Vth1 (where Vth1 is the threshold voltage of the transistor SW(K) of the bypass unit SU(K). In the example illustrated in FIG. 4B, this event occurs at time t3. At this point, transistor SW1(K) turns on, coupling the input terminal of the first enabled charge pump stage STG(K+1) to the output terminal of the charge pump CP1 (the transistor SW1(K) being diode-connected and forward biased). In this situation, as soon as the charge pump voltage Vp1 starts to recover from the drop (in the example at issue illustrated in FIG. 4B, the charge pump voltage Vp1 already started to recover from the drop before time t3), the voltage V(K) starts to increase toward its stationary value. Therefore, each of the voltages V(i+1) of the following charge pump stages STG(i+1) (i=K to M−1) will start to increase accordingly, being equal to about V(i)+Vdd.

When the charge pump voltage Vp1 exceeds the voltage threshold Vp1 TH (at time t4), the detection signal PD switches back from the first value to the second value. Thus, the control signals SC2($i$) of the bypass units SU(i) corresponding to the disabled charge pump stages STG(i) (i=1 to K) are switched to the first value for turning on the corresponding transistors SW2($i$). At this point, the voltage V(K) starts to directly follow the rise of the charge pump voltage Vp1 until the charge pump voltage Vp1 stabilizes to its stationary level, while the other voltages V(i) (i=K+1 to M) increases toward their stationary levels.

In an embodiment, due to the temporary deactivation of the transistors SW2(K) of the bypass units SU(K) of the last disabled charge pump stage STG(K), the direct electric connection between the output terminals of said disabled charge pump stage STG(i) and the output terminal of the charge pump CP1 is advantageously prevented or mitigated as long as the charge pump voltage Vp1 is subjected to a large decrease, preventing or mitigating thus that the transistors of the first enabled charge pump stage STG(K+1) experience excessive voltage differences, and avoiding breakdown of these transistors.

Naturally, in order to satisfy local and specific requirements, a person skilled in the art may apply to the embodiments described above many logical and/or physical modifications and alterations. More specifically, although various embodiments been described with a certain degree of particularity, it should be understood that various omissions, substitutions and changes in the form and details as well as other embodiments are possible. In particular, different embodiments may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in other embodiments.

For example, although in the embodiments described above the bypass units SU(i) are provided with a switch S1($i$) configured to selectively turn off the transistor SW1($i$)

during the charge pump CP2 discharge operation to avoid undesired drops in the charge pump voltage Vp1 due to the discharge of internal nodes of the charge pump CP2 during a discharge operation of the charge pump CP2, the concepts can be also applied in a case whereby the switch S1(*i*) is not provided.

What is claimed is:

1. A charge pump circuit comprising:
    a first charge pump including an input terminal configured for receiving a supply voltage, the first charge pump configured to boost the received supply voltage to provide at an output terminal of the first charge pump a first charge pump voltage; and
    a second charge pump including an input terminal coupled to the output terminal of the first charge pump and configured for receiving the first charge pump voltage, the second charge pump configured to boost the received first charge pump voltage to provide at an output terminal of the second charge pump a second charge pump voltage, wherein:
    the second charge pump comprises a sequence of charge pump stages connected in series between the input and output terminals of the second charge pump, each charge pump stage being configured to be selectively enabled to boost an input stage voltage at a stage input terminal by a voltage corresponding to the supply voltage to provide at a stage output terminal a corresponding output stage voltage when the charge pump stage is enabled,
    each charge pump stage is configured to be selectively disabled to bring its corresponding stage output terminal to a high impedance state and is associated with a corresponding bypass unit comprising a first transistor configured to electrically couple the stage output terminal to the output terminal of the first charge pump when the charge pump stage is disabled, the bypass unit further comprising a second transistor connected in parallel to the first transistor and being configured to be activated when the charge pump stage is disabled, and
    the charge pump circuit further comprises a voltage drop sensing device configured to detect drops in the first charge pump voltage and to deactivate the second transistors of the bypass unit associated to the disabled charge pump stages when a drop in the first charge pump voltage is detected.

2. The charge pump circuit of claim 1, wherein, in each bypass unit:
    the first transistor has a first conduction terminal connected to the output terminal of the first charge pump, a second conduction terminal connected to the stage output terminal of the corresponding charge pump stage, and a control terminal configured to be coupled to the output terminal of the first charge pump, and
    the second transistor has a first conduction terminal connected to the first conduction terminal of the first transistor, a second conduction terminal connected to the second conduction terminal of the first transistor, and a control terminal configured to be coupled to the output terminal of the second charge pump.

3. The charge pump circuit of claim 2, wherein each bypass unit further comprises a switch configured to connect the control terminal of the second transistor to the output terminal of the second charge pump to activate the second transistor, when the charge pump stage associated to the bypass unit is disabled or a reference terminal to deactivate the second transistor when the charge pump stage associated with the bypass unit is enabled.

4. The charge pump circuit of claim 3, wherein the voltage drop sensing device is configured to drive the switch of each bypass unit associated with the disabled charge pump stage to connect the control terminal of the second transistor to the reference terminal, when a drop in the first charge pump voltage is detected.

5. The charge pump circuit of claim 3, wherein the switch of each bypass unit is configured to connect the control terminal of the second transistor to the reference terminal when the second charge pump is being turned off.

6. The charge pump circuit of claim 1, comprising a charge pump control unit configured to selectively enable or disable target charge pump stages, among the sequence of charge pump stages, selected based on a predetermined value for the second charge pump voltage.

7. The charge pump circuit of claim 6, wherein the charge pump control unit is configured to disable the target charge pump stages, and the a number of the target charge pump stages is determined based on the predetermined value.

8. The charge pump circuit of claim 7, wherein the target charge pump stages comprises at least a first one of the sequence of charge pump stages, the first one of the sequence of charge pump stages including the stage input terminal configured to be coupled to the output terminal of the first charge pump when the second charge pump is active.

9. The charge pump circuit of claim 1, wherein each charge pump stage comprises switches and at least one capacitor that is periodically charged and discharged by the switches under the control of a corresponding control signal that oscillates following a clock signal when the charge pump stage is enabled and is fixed to a constant value when the charge pump stage is disabled.

10. The charge pump circuit of claim 8, wherein a respective first bypass unit of the corresponding bypass units comprises a first transistor configured to electrically couple the output terminal of the first charge pump to an input terminal of the first one of the sequence of charge pump stages.

11. The charge pump circuit of claim 1, wherein the voltage drop sensing device is configured to detect a drop in the first charge pump voltage when the first charge pump voltage decreases lower than a corresponding voltage threshold.

12. The charge pump circuit of claim 1, wherein each bypass unit comprises a switch configured to connect the control terminal of the first transistor to the first conduction terminal of the first transistor when the second charge pump is active or a reference terminal for deactivating the first transistor when the second charge pump is being turned off.

* * * * *